(12) United States Patent
Kitabata et al.

(10) Patent No.: US 10,529,599 B2
(45) Date of Patent: Jan. 7, 2020

(54) SUBSTRATE PROCESSING APPARATUS AND SHUTTER MEMBER

(71) Applicant: TOKYO ELECTRON LIMITED, Tokyo (JP)

(72) Inventors: Toshinori Kitabata, Miyagi (JP); Yusuke Hayasaka, Miyagi (JP); Kazuya Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1188 days.

(21) Appl. No.: 14/527,464

(22) Filed: Oct. 29, 2014

(65) Prior Publication Data

US 2015/0114564 A1    Apr. 30, 2015

(30) Foreign Application Priority Data

Oct. 30, 2013    (JP) .................................. 2013-225968

(51) Int. Cl.
| | |
|---|---|
| H01L 21/67 | (2006.01) |
| H01J 37/32 | (2006.01) |
| F16C 29/02 | (2006.01) |
| F16K 3/02 | (2006.01) |
| H01L 21/677 | (2006.01) |

(52) U.S. Cl.
CPC ........ *H01L 21/67126* (2013.01); *F16C 29/02* (2013.01); *H01J 37/32477* (2013.01); *H01J 37/32495* (2013.01); *H01J 37/32513* (2013.01); *H01J 37/32651* (2013.01); *H01L 21/67739* (2013.01); *F16K 3/02* (2013.01)

(58) Field of Classification Search
CPC .......... F16K 41/00; F16K 41/02; F16K 41/04; F16K 3/02; F16K 51/02; F16K 3/0227
See application file for complete search history.

(56) References Cited

U.S. PATENT DOCUMENTS

| | | | | |
|---|---|---|---|---|
| 5,435,650 | A * | 7/1995 | Emig ...................... | F16C 29/02 384/275 |
| 2004/0149214 | A1* | 8/2004 | Hirose .............. | H01J 37/32458 118/715 |
| 2004/0182324 | A1* | 9/2004 | Wallace .............. | C23C 16/4405 118/733 |

FOREIGN PATENT DOCUMENTS

| | | |
|---|---|---|
| JP | 2006-194303 A | 7/2006 |
| JP | 2011-171763 A | 9/2011 |

* cited by examiner

*Primary Examiner* — Rakesh K Dhingra
*Assistant Examiner* — Laureen Chan
(74) *Attorney, Agent, or Firm* — Rothwell, Figg, Ernst & Manbeck, P.C.

(57) ABSTRACT

In a substrate processing apparatus of the present disclosure, a bearing member includes a decaying mechanism provided with a connecting shaft inserted therein and configured to decay radicals or ions; a first member configured to cover the decaying mechanism; and a second member disposed at the connecting shaft and provided with the connecting shaft inserted therein while being in contact with a sealing member. Further, an end of the first member and an end of the second member are connected to be engaged with each other, an invasion path is formed to allow the radicals to invade from the connected portion of the end of the first member and the end of the second member, and the invasion path is formed to be folded back in an extending direction of the connecting shaft. The sealing member is made of a material having a tensile strength larger than 12.1 MPa.

14 Claims, 11 Drawing Sheets

SUBSTRATE PROCESSING APPARATUS AND SHUTTER MEMBER

CROSS-REFERENCE TO RELATED APPLICATIONS

This application is based on and claims priority from Japanese Patent Application No. 2013-225968, filed on Oct. 30, 2013, with the Japan Patent Office, the disclosure of which is incorporated herein in its entirety by reference.

TECHNICAL FIELD

Various aspects and exemplary embodiments of the present invention relate to a substrate processing apparatus and a shutter member.

BACKGROUND

Conventionally, a plasma processing apparatus has been known, in which a desired plasma processing is performed on a wafer for a semiconductor device as a substrate. The plasma processing apparatus includes, for example, a chamber configured to accommodate a wafer. The chamber is provided with a placing table (hereinafter, referred to as a "susceptor") serving as a lower electrode configured to place thereon and an upper electrode which is opposite to the susceptor. Further, a high frequency power source is connected to at least one of the placing table and the upper electrode so that the placing table and the upper electrode apply high frequency power into a space of a processing chamber.

In the plasma processing apparatus, a desired plasma processing, that is, an etching processing, is performed on the wafer by converting a processing gas supplied in the space of the processing chamber into plasma by the high frequency power to generate ions or radicals and inducing the ions or the radicals into the wafer.

An opening for carrying in or out the semiconductor wafer is provided on a sidewall of the chamber. A gate valve is disposed to open and close the opening, and the semiconductor wafer is carried in or out by opening or closing the gate valve. The gate valve is provided outside the chamber (at an air side) so that a space where the opening protrudes to the air side is formed and the plasma which is generated in the chamber is diffused into the space. Therefore, uniformity of the plasma may be deteriorated. Further, a sealing member of the gate valve is deteriorated by the plasma so that a configuration in which the opening is blocked by a shutter is employed. Further, for example, a driving unit of the shutter is disposed below the opening, and the shutter is opened or closed by the driving unit. See, for example, Japanese Laid-Open Patent Publication No. 2011-171763 and Japanese Laid-Open Patent Publication No. 2006-194303.

SUMMARY

According to an aspect, a substrate processing apparatus of the present disclosure includes a chamber provided with an opening and maintained air-tightly by depressurization; a first opening/closing member configured to carry the substrate into or out of the chamber, and open or close the opening; a second opening/closing member configured to open or close the opening from the inside of the chamber; a driving unit configured to open or close the second Opening/closing member; a connecting shaft configured to connect the second opening/closing member with the driving unit; and a bearing member provided in the connecting shaft and configured to block the chamber from an atmosphere and, at the same time, decay radicals or ions. Further, in the substrate processing apparatus of the present disclosure, the bearing member includes: a decaying mechanism provided with the connecting shaft inserted therein and configured to decay the radicals or the ions; a first block type of a first member configured to cover the decaying mechanism; and a second block type of a second member disposed at the connecting shaft and provided with the connecting shaft inserted therein while being in contact with a sealing member that blocks the atmosphere. Further, in the substrate processing apparatus of the present disclosure, an end of the first member and an end of the second member are connected to be engaged with each other, an invasion path is formed to allow the radicals to invade from the connected portion of the end of the first member and the end of the second member, and the invasion path is formed to be folded back in an extending direction of the connecting shaft. Further, in the substrate processing apparatus of the present disclosure, the sealing member is made of a material having a tensile strength larger than 12.1 MPa.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the above-described technology, airtightness of the chamber is undesirably lowered. Since processes have evolved from the time when the cited references have been published, and hence, more severe conditions are used, there is a problem in this structure.

According to an aspect, a substrate processing apparatus of the present disclosure includes a chamber provided with an opening and maintained air-tightly by depressurization; a first opening/closing member configured to carry the substrate into or out of the chamber, and open or close the opening; a second opening/closing member configured to open or close the opening from the inside of the chamber; a driving unit configured to open or close the second opening/closing member; a connecting shaft configured to connect the second opening/closing member with the driving unit; and a bearing member provided in the connecting shaft and configured to block the chamber from an atmosphere and, at the same time, decay radicals or ions. Further, in the substrate processing apparatus of the present disclosure, the bearing member includes: a decaying mechanism provided with the connecting shaft inserted therein and configured to decay the radicals or the ions; a first block type of a first member configured to cover the decaying mechanism; and a second block type of a second member disposed at the connecting shaft and provided with the connecting shaft inserted therein while being in contact with a sealing member that blocks the atmosphere. Further, in the substrate processing apparatus of the present disclosure, an end of the first member and an end of the second member are connected to be engaged with each other, an invasion path is formed to allow the radicals to invade from the connected portion of the end of the first member and the end of the second member, and the invasion path is formed to be folded back in an extending direction of the connecting shaft. Further, in the substrate processing apparatus of the present disclosure, the sealing member is made of a material having a tensile strength larger than 12.1 MPa.

According to an aspect of the substrate processing apparatus of the present disclosure, damage of the sealing member may be suppressed by decaying the radicals, and the airtightness of the chamber may be maintained by using the sealing member as a durability member.

Hereinafter, exemplary embodiments of a substrate processing apparatus of the present disclosure will be described in detail with reference to drawings. Further, the present disclosure is not limited to the exemplary embodiments. The exemplary embodiments may be appropriately combined as long as processing contents are not contradictory to each other.

First Exemplary Embodiment

According to an aspect, a substrate processing apparatus of a first exemplary embodiment includes a chamber provided with an opening and maintained air-tightly by depressurization; a first opening/closing member configured to carry the substrate into or out of the chamber, and open or close the opening; a second opening/closing member configured to open or close the opening from the inside of the chamber; a driving unit configured to open or close the second opening/closing member; a connecting shaft configured to connect the second opening/closing member with the driving unit; and a bearing member provided in the connecting shaft and configured to block the chamber from an atmosphere and, at the same time, decay radicals or ions. Further, in the substrate processing apparatus of the first exemplary embodiment, the bearing member includes: a decaying mechanism provided with the connecting shaft inserted therein and configured to decay the radicals or the ions; a first block type of a first member configured to cover the decaying mechanism; and a second block type of a second member disposed at the connecting shaft and provided with the connecting shaft inserted therein while being in contact with a sealing member that blocks the atmosphere. Further, in the substrate processing apparatus of the first exemplary embodiment, an end of the first member and an end of the second member are connected to be engaged with each other, an invasion path is formed to allow the radicals to invade from the connected portion of the end of the first member and the end of the second member, and the invasion path is formed to be folded back in an extending direction of the connecting shaft. Further, in the substrate processing apparatus of the first exemplary embodiment, the sealing member is made of a material having a tensile strength larger than 12.1 MPa.

In the substrate processing apparatus of the first exemplary embodiment, the decaying mechanism is formed with a convex portion in an inner side which is in contact with the connecting shaft, and a tip end of the convex portion is in contact with the connecting shaft.

In the substrate processing apparatus of the first exemplary embodiment, the decaying mechanism is a radical trap ring.

In the substrate processing apparatus of the first exemplary embodiment, the sealing member is formed of an O-ring, and the O-ring is a fluorinated O-ring.

In the substrate processing apparatus of the first exemplary embodiment, the bearing member further includes a convex portion provided between an inner wall of the second member which faces the connecting shaft and the connecting shaft and between an inner wall of the first member which faces the connecting shaft and the connecting shaft, and extends in the extending direction of the connecting shaft to be fitted into the third member.

According to another aspect, a shutter member of the first exemplary embodiment includes a second opening/closing member configured to open or close an opening of a chamber which is maintained air-tightly by depressurized, from the inside of the chamber; a driving unit configured to open or close the second opening/closing member; a connecting shaft configured to connect the second opening/closing member with the driving unit; and a bearing member provided in the connecting shaft to block the chamber from an atmosphere and decay radicals or ions. Further, in the shutter member of the first exemplary embodiment, the bearing member includes a decaying mechanism provided with the connecting shaft inserted therein and configured to decay the radicals or the ions; a first block type of a first member configured to cover the decaying mechanism; and a second block type of a second member disposed at the connecting shaft and provided with the connecting shaft inserted therein while being in contact with a sealing member that blocks the atmosphere. Further, in the shutter member of the first exemplary embodiment, an end of the first member and an end of the second member are connected to be engaged with each other, an invasion path is formed to allow the radicals to invade from the connected portion of the end of the first member and the end of the second member, and the path is formed to be folded back in the extending direction of the connecting shaft. Further, in the shutter member of the first exemplary embodiment, the sealing member is made of a material having a tensile strength which is larger than 12.1 MPa.

In the shutter member of the first exemplary embodiment, the decaying mechanism is formed with a convex portion in an inner side which is in contact with the connecting shaft, and a tip end of the convex portion is in contact with the connecting shaft.

In the shutter member of the first exemplary embodiment, the decaying mechanism is a radical trap ring.

In the shutter member of the first exemplary embodiment, the sealing member is formed of an O-ring, and the O-ring is a fluorinated O-ring.

In the shutter member of the first exemplary embodiment, the bearing member further includes a convex portion provided between an inner wall of the second member which faces the connecting shaft and the connecting shaft and between an inner wall of the first member which faces the connecting shaft and the connecting shaft, and extends in the extending direction of the connecting shaft to be fitted into the third member.

Substrate Processing Apparatus According to First Exemplary Embodiment

Figure 1:
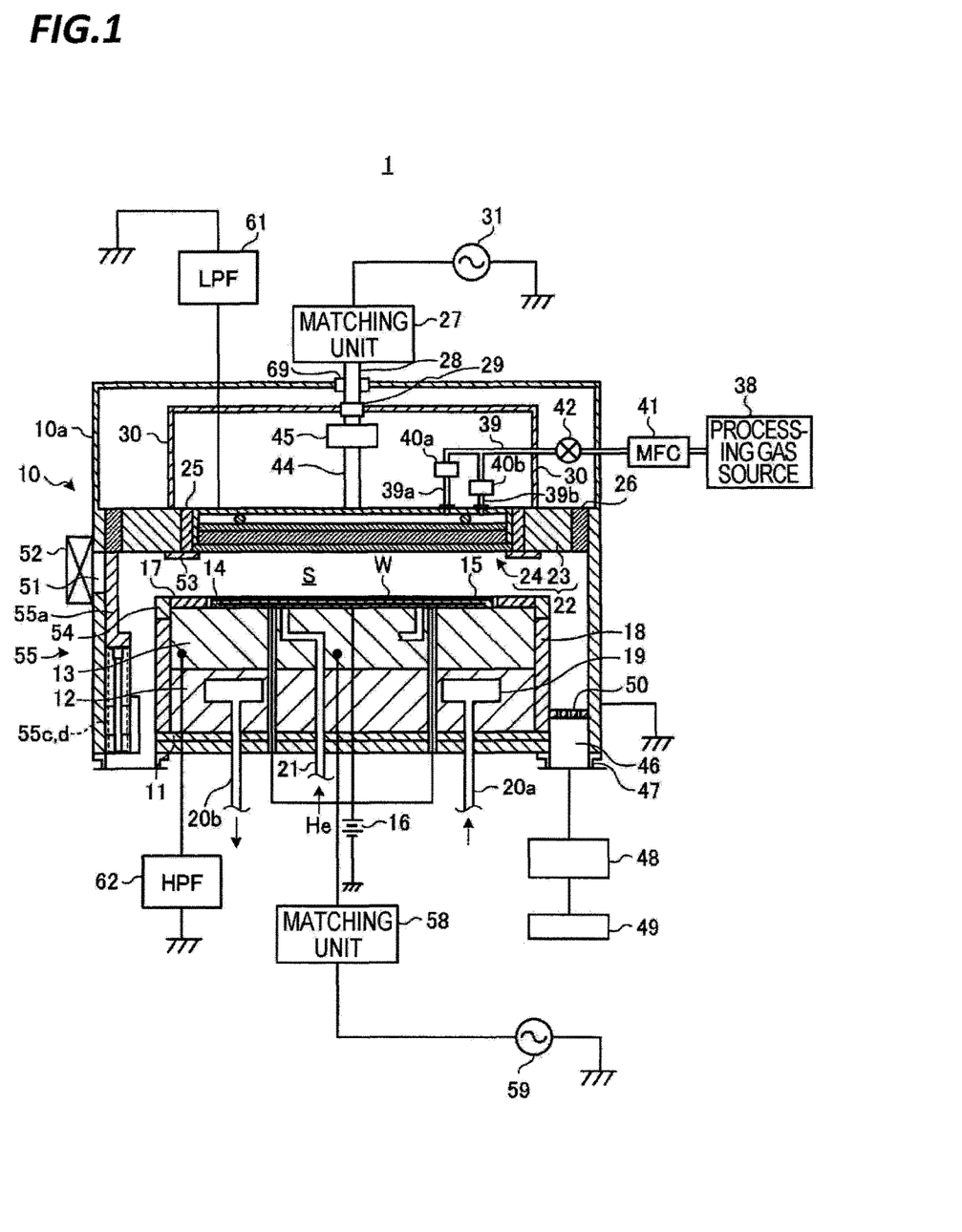
FIG. 1 is a cross-sectional view illustrating a schematic configuration of a substrate processing apparatus according to a first exemplary embodiment.

FIG. 1 is a cross-sectional view illustrating a schematic configuration of a substrate processing apparatus according to a first exemplary embodiment. Hereinafter, even though it is exemplified that the substrate processing apparatus is a plasma processing apparatus, the substrate processing apparatus is not limited thereto and may be any substrate processing apparatus having a shutter member.

In FIG. 1, a plasma processing apparatus 1 is configured by a capacitively coupled parallel plate type plasma etching apparatus and for example, includes a cylindrical chamber (a processing container) 10 whose surface is made of an alumite-treated (anodized) aluminum. The chamber 10 is safely grounded. The plasma processing apparatus 1 is not limited thereto and may be not only the capacitively coupled parallel plate type plasma etching apparatus, but may also be applied to inducitively coupled plasma (IPC), microwave plasma, magnetron plasma, and may be an arbitrary type of plasma processing apparatus.

A circular cylindrical susceptor supporting table 12 is disposed on a bottom of the chamber 10 through an insulating plate 11, such as ceramic, therebetween and a conductive susceptor 13 made of, for example, aluminum is disposed on the susceptor supporting table 12. The susceptor 13 has a configuration serving as a lower electrode and a substrate to which the etching treatment is subjected, for example, a semiconductor wafer W is displaced thereon.

An electrostatic chuck (ESC) 14 is disposed on a top surface of the susceptor 13 to hold the semiconductor wafer W by an electrostatic adsorption force is disposed. The electrostatic chuck 14 is formed of an electrode plate 15 made of a conductive film and a pair of insulating layers with the electrode plate 15 interposed therebetween, for example, a dielectric substance such as $Y_2O_4$, $Al_2O_3$, or AlN and a DC power source 16 is electrically connected to the electrode plate 15 through a connection terminal. The electrostatic chuck 14 adsorbs and holds the semiconductor wafer W by a column force or a Johnsen-Rahbek force caused by the DC voltage applied by the DC power source 16.

In a portion of the top surface of the electrostatic chuck 14 in which the semiconductor wafer W is adsorbed and held, a plurality of (e.g., three) pusher pins is disposed as lift pins which are protrudable from the top surface of the electrostatic chuck 14. These pusher pins are connected to a motor (not illustrated) through a ball screw (not illustrated) and are protrudable from the top surface of the electrostatic chuck 14 due to a rotary motion of the motor which is converted into a linear motion by the ball screw. When the etching treatment is performed on the semiconductor wafer W and the electrostatic chuck 14 holds and adsorbs the semiconductor wafer W, the pusher pins are accommodated in the electrostatic chuck 14 and when the semiconductor wafer W that is subjected to the etching treatment is carried out from a plasma generating space S, the pusher pins protrude from the susceptor 15 to separate the semiconductor wafer W from the electrostatic chuck 14 to be upwardly lifted.

A focus ring 17 made of silicon (Si) is disposed on the top surface around the susceptor 15 to improve uniformity of etching, and a cover ring 54 is disposed around the focus ring 17 to protect a side of the focus ring 17. Further, a cylindrical member 18 made of quartz ($SiO_2$) covers side surfaces of the susceptor 13 and the susceptor supporting table 12.

A coolant chamber 19 is disposed in the susceptor supporting table 12 to extend in a circumferential direction. A coolant at a predetermined temperature, for example, cooling water is circulated from a chiller unit (not illustrated), which is attached outside, in the coolant chamber 19 through pipes 20a and 20b. The coolant chamber 19 controls a processing temperature of the semiconductor wafer W on the susceptor 13 by the temperature of the coolant.

Heat transfer gas, for example, helium (He) gas is supplied from a heat transfer gas supplying machine (not illustrated) between the top surface of the electrostatic chuck 14 and a rear surface of the semiconductor wafer W through a gas supply line 21 so that heat transfer between the wafer and the susceptor is efficiently and uniformly controlled.

An upper electrode 22 is disposed above the susceptor 13 to be parallel and opposite to the susceptor 13. Here, a space formed between the susceptor 13 and the upper electrode 22 serves as the plasma generating space (S) (a space in a processing chamber). The upper electrode 22 is configured by a ring or donut-shaped outer upper electrode 23 which is disposed to be opposite to the susceptor 13 at predetermined intervals, and a disc-shaped inner upper electrode 24 which is disposed to be insulated from the outer upper electrode 23 in a radial direction of the outer upper electrode 23. Further, when the plasma is generated, the outer upper electrode 23 is a main element and the inner upper electrode 24 is an assisting element.

Figure 2:
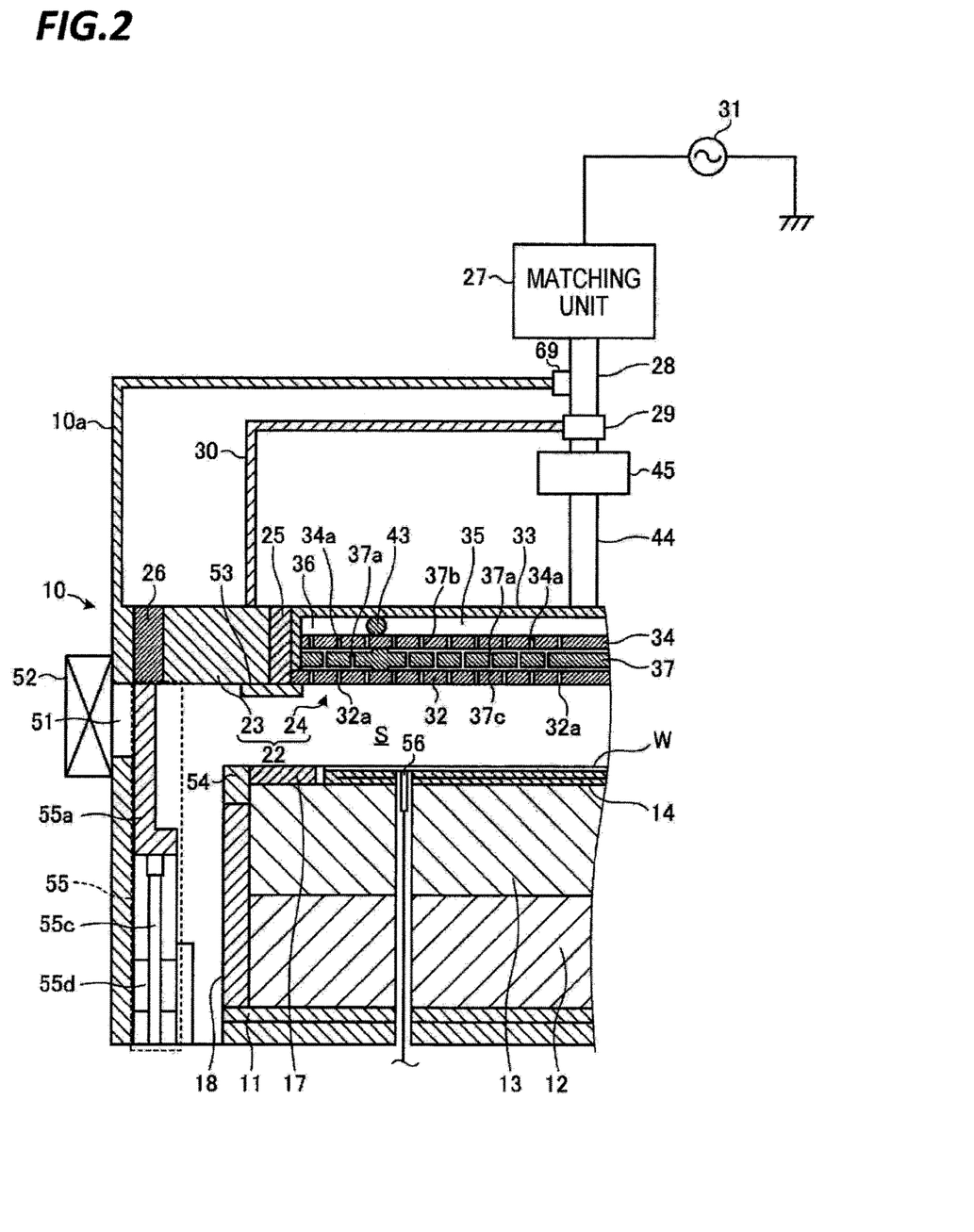
FIG. 2 is an enlarged cross-sectional view illustrating a schematic configuration around a shutter member of FIG. 1.

FIG. 2 is an enlarged cross-sectional view illustrating a schematic configuration around the upper electrode of FIG. 1.

In FIG. 2, a circular gap (interval) of, for example, 0.25 to 2.0 mm is formed between the outer upper electrode 23 and the inner upper electrode 24 and a dielectric substance 25 made of, for example, quartz is disposed in the gap. Further, in the gap, instead of the dielectric substance 25 made of quartz, a ceramic substance may be disposed. The dielectric substance 25 is interposed between the outer upper electrode 23 and the inner upper electrode 24 so that a capacitor is formed. A capacitance C1 of the capacitor may be selected or adjusted to a desired value depending on a size of the gap and a dielectric constant of the dielectric substance 25. Further, between the outer upper electrode 23 and the side wall of the chamber 10, for example, a ring shaped insulating shielding member 26 made of alumina ($Al_2O_3$) or yttria ($Y_2O_3$) is air-tightly disposed.

The outer upper electrode 23 may be configured by a low-resistivity conductive material or semiconductor having low Joule heat, for example, silicon. An upper high frequency power source 31 is electrically connected to the outer upper electrode 23 via an upper matching unit 27, an upper power feeding rod 28, a connector 29, and a power feeding tube 30. The upper high frequency power source 31 outputs a high frequency power having a frequency of 13.5 MHz or higher, for example, 60 MHz. The upper matching unit 27 matches a load impedance with an internal (or output) impedance of the upper high frequency power source 31 so that when the plasma is generated in the chamber 10, the output impedance of the upper high frequency power source 31 and the load impedance look the same. Further an output terminal of the upper matching unit 27 is connected to an upper end of the upper power feeding rod 28.

The power feeding tube 30 is configured by a substantially cylindrical or conical conductive plate, for example, an aluminum plate or a copper plate and a lower end thereof is continuously connected to the outer upper electrode 23 in a circumferential direction and an upper end is electrically connected to a lower end of the upper power feeding rod 28 through a connector 29. At the outside of the power feeding tube 30, the side wall of the chamber 10 extends to be higher than a height position of the upper electrode 22 to form a cylindrical grounded conductor 10a. An upper end of the cylindrical grounded conductor 10a is electrically isolated from the upper power feeding rod 28 by a tubular insulating member 69. In this configuration, in a load circuit seen from the connector 29, a coaxial line which has the power feeding tube 30 and the outer upper electrode 23 as a waveguide is formed by the power feeding tube 30, the outer upper electrode 23, and the cylindrical grounded conductor 10a.

The inner upper electrode 24 has an upper electrode plate 32 which has a plurality of electrode plate gas vent holes 32a (first gas vent holes) and is formed of a semiconductor material such as silicon or silicon carbide (SiC) and an electrode support 33 made of a conductive material which detachably supports the upper electrode plate 32, for example, aluminum whose surface is subjected to alumite treatment. The upper electrode plate 32 is fastened to the electrode support 33 by a bolt (not illustrated). A head part of the bolt is protected by a ring shaped shield ring 53 which is disposed below the upper electrode plate 32.

In the upper electrode plate 32, the electrode plate gas vent holes 32a penetrate the upper electrode plate 32. A buffer chamber into which a processing gas to be described below is introduced is formed in the electrode support 33 and the buffer chamber is configured by two buffer chambers which are divided by a ring shaped partition member 43 having an O-ring, that is, a center buffer chamber 35 and a peripheral buffer chamber 36 and lower portions of the buffer chambers are open. Below the electrode support 33, a cooling plate (hereinafter, abbreviated as "C/P") 34 (intermediate member) which blocks the lower portion of the buffer chamber is disposed. The C/P 34 is made of aluminum whose surface is subjected to alumite treatment and has a plurality of C/P gas vent holes 34a (second gas vent holes). In the C/P 34, the C/P gas vent holes 34a penetrate the C/P 34.

A spacer 37 made of a semiconductor material such as silicon or silicon carbide is interposed between the upper electrode plate 32 and the C/P 34.

The spacer 37 is a disc shaped member and has a plurality of top surface circular grooves 37b which is concentrically formed with the disc on a surface (hereinafter, simply referred to as a "top surface") that faces the C/P 34 and a plurality of spacer gas vent holes 37a (third gas vent holes) which penetrates the spacer 37 and is formed on a bottom of open top surface circular grooves 37b.

The inner upper electrode 24 supplies the processing gas which is introduced from a processing gas source 38 to be described below to the buffer chamber to the plasma generating space S through the C/P gas vent holes 34a of the C/P 34, a spacer gas flow channel 37c of the spacer 37 and the electrode plate gas vent holes 32a of the upper electrode plate 32. Here, the center buffer chamber 35 and the plurality of C/P gas vent holes 34a and the spacer gas flow channel 37c and the electrode plate gas vent holes 32a which are present below the center buffer chamber 35 configure a center shower head (a processing gas supply path) and the peripheral buffer chamber 36 and the plurality of C/P gas vent holes 34a, the spacer gas flow channel 37C and the electrode plate gas vent holes 32a which are present below the peripheral buffer chamber 36 configure a peripheral shower head (a processing gas supply path).

In FIG. 1, the processing gas source 38 is disposed outside the chamber 10. The processing gas source 38 supplies the processing gas to the center buffer chamber 35 and the peripheral buffer chamber 36 at a desired flow rate. Specifically, a gas supply tube 39 from the processing gas source 38 is diverged into two diverging tubes 39a and 39b in a portion therebetween to be connected to the center buffer chamber 35 and the peripheral buffer chamber 36 and the diverging tubes 39a and 39b have flow rate control valves (flow rate control devices) 40a and 40b, respectively. Conductances of the flow channel from the processing gas source 38 to the center buffer chamber 35 and the peripheral buffer chamber 36 are set to be the same, so that the flow rates of the processing gas which is supplied to the center buffer chamber 35 and the peripheral buffer chamber 36 may be arbitrarily adjusted by adjusting the flow rate control valves 40a and 40b. Further, a mass flow controller (MFC) 41 and an on/off valve 42 are disposed in the gas supply tube 39.

With this configuration, the plasma processing apparatus adjusts the flow rates of the processing gas which is introduced into the center buffer chamber 35 and the peripheral buffer chamber 36 so as to arbitrarily adjust a ratio FC/FE of a flow rate FC of gas which is ejected from the center shower head and a flow rate FE of gas which is ejected from the peripheral shower head. Further, the plasma processing apparatus 1 may individually adjust a flow rate of the processing gas ejected from the center shower head and the peripheral shower head per unit area. Further, two processing gas sources corresponding to the diverging tubes 39a and 39b, respectively, are disposed, so that gaseous species or a gas mixture ratio of the processing gases ejected from the center shower head and the peripheral shower head may be independently or separately set. However, the plasma processing apparatus 1 is not limited thereto but the plasma processing apparatus 1 may not adjust the ratio of the flow rate FC of gas which is ejected from the center shower head and the flow rate FE of gas which is ejected from the peripheral shower head.

The upper high frequency power source 31 is electrically connected to the electrode support 33 of the inner upper electrode 24 via the upper matching unit 27, the upper power feeding rod 28, the connector 29, and an upper power feeding tube 44. A variable capacitor 45 which may variably adjust the capacitance is disposed in the middle of the upper power feeding tube 44. Further, the coolant chamber or a cooling jacket (not illustrated) is provided also in the outer upper electrode 23 and the inner upper electrode 24, so that the temperature of the electrode may be controlled by the coolant supplied from an external chiller unit (not illustrated).

An exhaust port 46 is provided on the bottom of the chamber 10 and an automatic pressure control valve (hereinafter, referred to as "APC valve") 48 which is a variable butterfly valve and a turbo molecular pump (hereinafter, referred to as a "TMP") 49 are connected to the exhaust port 46 though an exhaust manifold 47. The APC valve 48 and the TMP 49 cooperate to reduce pressure in the plasma generating space S of the chamber 10 at a desired degree of vacuum. Further, a circular baffle plate 50 having a plurality of vent holes is disposed between the exhaust port 46 and the plasma processing space S so as to enclose the susceptor supporting table 12 and the baffle plate 50 prevents leakage of the plasma from the plasma generating space C to the exhaust port 46.

The semiconductor wafer W is carried in/out is provided and a gate valve 52 (providing an opening/closing member) is disposed to open and close the opening 51, and the semiconductor wafer W is carried in/out by opening/closing the gate valve 52. However, the gate valve 52 is provided outside the chamber 10 (in the atmosphere), so that a space where the opening 51 protrudes to the atmosphere is formed and the plasma which is generated in the chamber 10 is diffused in the space, which may deteriorate uniformity of the plasma. Further, the sealing member of the gate valve 52 is deteriorated by the plasma, so that a configuration in which the opening 51 is blocked by the shutter 55a is employed. Further, in the shutter 55a, the driving unit 55b of the shutter 55a is disposed below the opening 51 and the shutter 55a is opened or closed by the driving unit 55b. Here, a decaying mechanism 70, a first member 80, and a second member 100 to be described below are fixed and the connecting shaft 55c which is connected to the shutter 55a moves the holes of the bearing member 55d up and down, so that the shutter 55a moves up and down to open and close the chamber 10. Details of the shutter member 55 will be described below, so that a detailed description thereof will be omitted here.

In the plasma processing apparatus 1, a lower high frequency power source 59 is electrically connected to the susceptor 13 serving as a lower electrode by a lower matching unit 58. The lower high frequency power source 59 outputs a high frequency power having a frequency in the range of 2 to 27 MHz, for example, 2 MHz. The lower matching unit 58 matches a load impedance with an internal (or output) impedance of the lower high frequency power source 59, so that when the plasma is generated in the plasma generating space S in the chamber 10, the internal impedance of the lower high frequency power source 59 and the load impedance look the same.

A pusher pin 56 penetrates the electrostatic chuck 14 and the susceptor 13 to move up and down to protrude from and retract to the inner space.

A low pass filter (LPF) 61, which does not pass the high frequency power (60 MHz) from the upper high frequency power source 31 through the ground but passes the high frequency power (2 MHz) from the lower high frequency power source 59 through the ground, is electrically connected to the inner upper electrode 24 in the plasma processing apparatus 1. The LPF 61 may be configured by an LR filter or an LC filter. However, even when one conductive wire is used, sufficiently large reactance may be imparted for the high frequency power from the upper high frequency power source 31, so that instead of the LR filter or the LC filter, one conductive wire may only be electrically connected to the inner upper electrode 24. In the meantime, a high pass filter (HPF) 62 which passes the high frequency power from the upper high frequency power source 31 through the ground is electrically connected to the susceptor 13.

Next, in the plasma processing apparatus 1, in order to perform etching, first, the gate valve 52 is open and then the semiconductor wafer W to be processed is carried in the chamber 10 to be displaced on the susceptor 13. Further, the processing gas from the processing gas source 38, that is, a mixture gas of C4F8 gas and argon (Ar) gas is introduced into the center buffer chamber 35 and the peripheral buffer chamber 36 at a predetermined flow rate and a predetermined ratio of flow rates and a pressure of the plasma generating space S in the chamber 10 is set to an appropriate value for etching, for example, any value in the range of several m Torr to 1 Torr, by the APC valve 48 and the TMP 49.

High frequency power for plasma generation, for example, 60 MHz is applied to the upper electrode 22 (the outer upper electrode 23 and the inner upper electrode 24) by the upper high frequency power source 31 at predetermined power and also bias high frequency power, for example, 2 MHz, from the lower high frequency power source 59 is applied to the lower electrode of the susceptor 13 at predetermined power. Further, the DC voltage is applied from the DC power source 16 to the electrode plate 15 of the electrostatic chuck 14 so as to electrostatically adsorb the semiconductor wafer W onto the susceptor 13.

Next, the processing gas ejected from the shower head turns into plasma in the processing surface S of the upper electrode 22 and the susceptor 13 and a surface to be processed of the semiconductor wafer W is physically or chemically etched by radicals or ions generated in this time.

In the plasma processing apparatus 1, a high frequency in a high frequency region (5 to 10 MHz at which ions cannot migrate) is applied to the upper electrode 22, so that the plasma may be densified in a desirable dissociative state, so that a high density plasma may be formed in a lower pressure condition.

In the meantime, in the upper electrode 22, as the high frequency electrode for plasma generation, the outer upper electrode 23 serves as a main element and the inner upper electrode 24 serves as an assistant element and a ratio of intensities of electric fields which are imparted, to electrons immediately below the upper electrode 22 may be adjusted by the upper high frequency power source 31 and the lower high frequency power source 59. Therefore, a spatial distribution of ion density is controlled in a radial direction, so that a spatial property of reactive ion etching may be arbitrarily and precisely controlled.

Figure 3A:
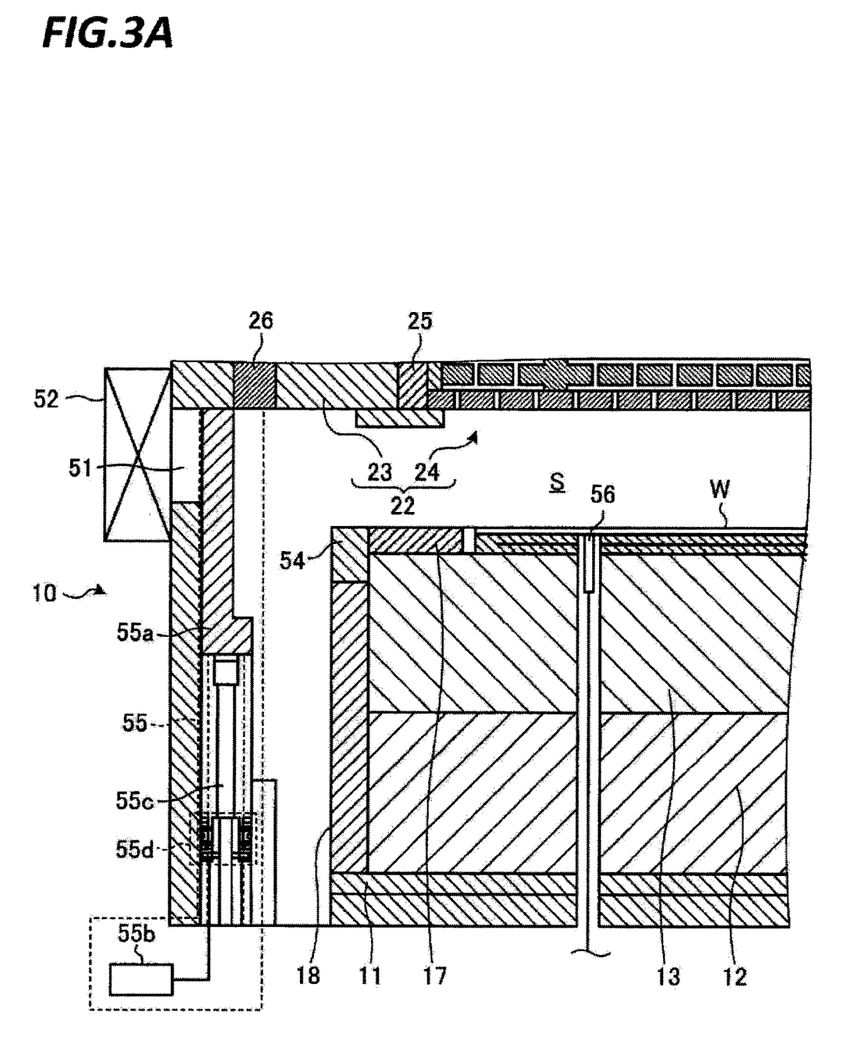
FIG. 3A is a view illustrating a configuration of a state where a shutter of a shutter member is closed in the first exemplary embodiment.
Figure 3B:
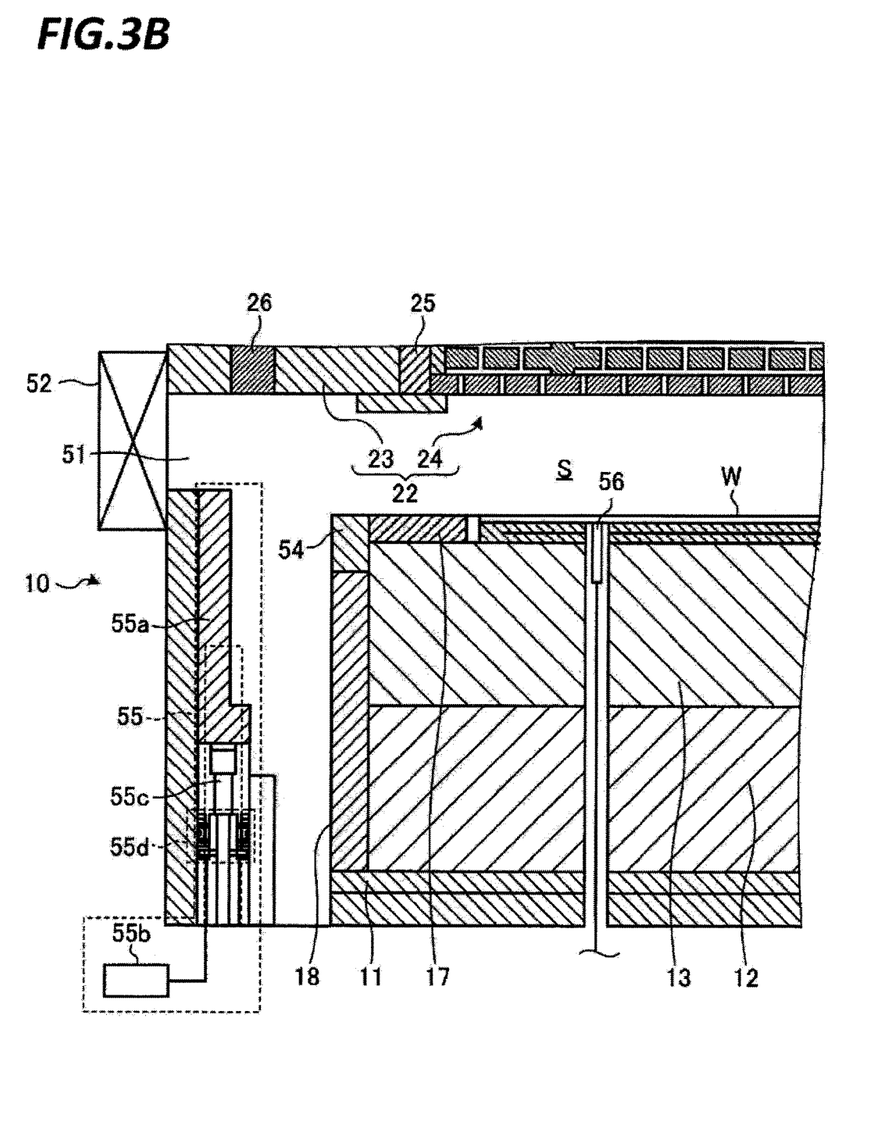
FIG. 3B is a view illustrating a configuration of a state where a shutter of a shutter member is open in the first exemplary embodiment.

Next, the shutter member 55 of the first exemplary embodiment will be described. As illustrated in FIG. 3, the shutter member 55 includes a shutter 55a which opens or closes the opening 51 of the chamber 10 from the inside of the chamber 10, a driving unit 55b which opens or closes the shutter 55a, a connecting shaft 55c which is a shaft connecting the shutter 55a with the driving unit 55b, and a bearing member 55d which is a bearing supporting the connecting shaft 55c. FIG. 3A illustrates a state where the shutter 55a is closed and FIG. 3B illustrates a state where the shutter 55a is open.

Figure 4:
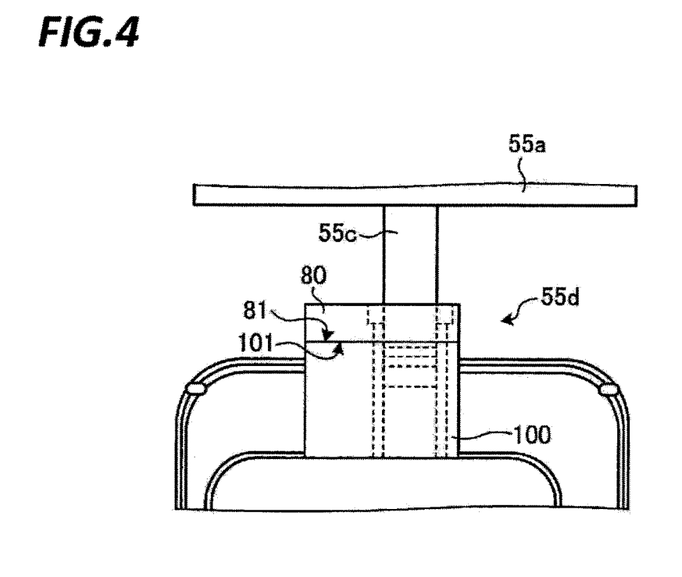
FIG. 4 is a view of a bearing member of the first exemplary embodiment.
Figure 5:
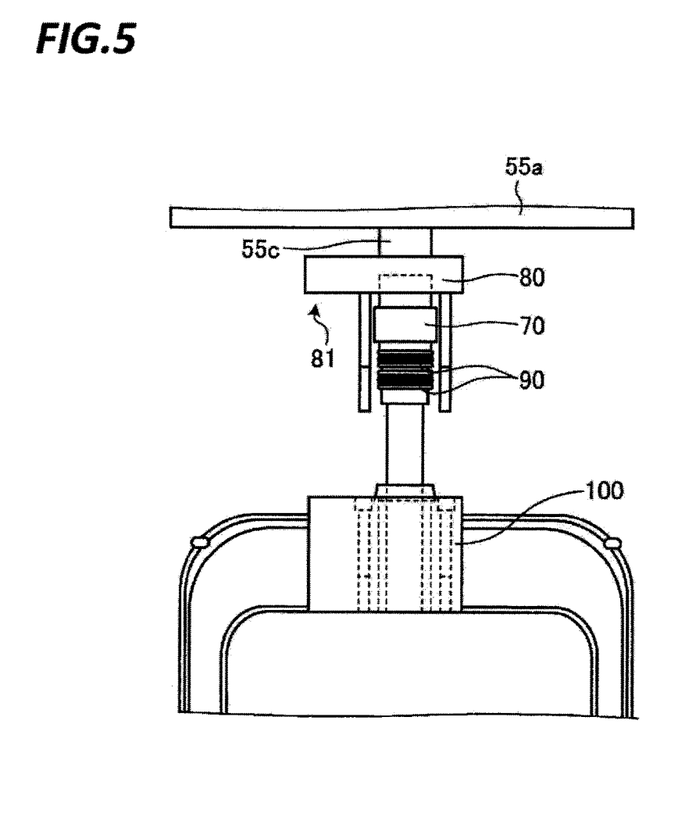
FIG. 5 is a view of a bearing member of the first exemplary embodiment.

FIGS. 4 and 5 are views of a bearing member of the first exemplary embodiment. The bearing member 55d includes a decaying mechanism 70 into which the connecting shaft 55c is inserted and which decays the radical or the ion, a first block type of a first member 80 which covers the decaying mechanism 70, and a second block type as a second member 100 which is disposed at the connecting shaft 55c to be in contact with the sealing member 90 which blocks the atmosphere to insert the sealing member 90. Further, in a portion corresponding to the bearing member 55d, the sealing member 90 is provided at the connecting shaft 55c. In an example illustrated in FIG. 5, two O-rings are provided as the sealing member 90. As illustrated in FIGS. 4 and 5, the bearing member 55d is fixed onto a driving cover by a screw such that the connecting shaft 55c is inserted and a first surface 81 of the first member 80 and a first surface 101 of the second member 100 are in contact with each other.

Figure 6A:
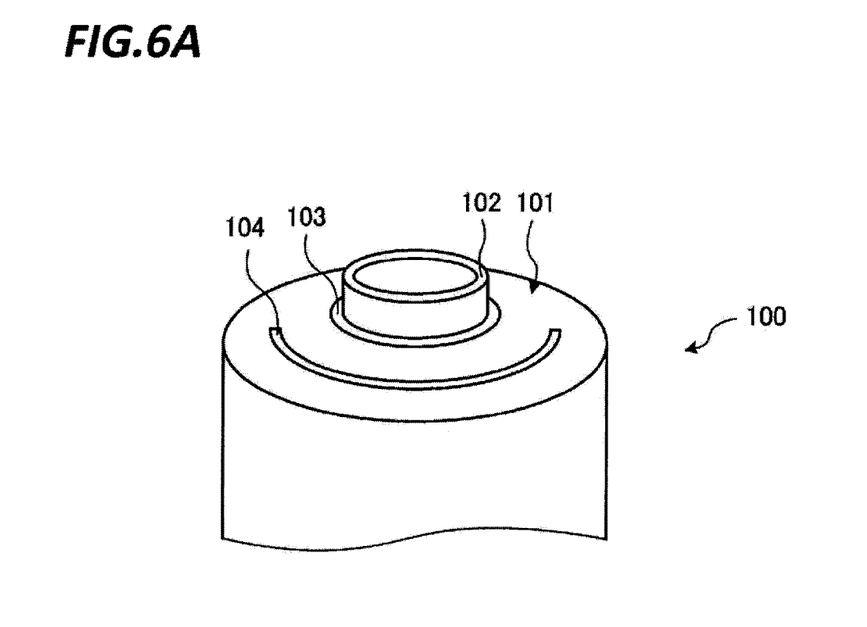
FIG. 6A is an example of a perspective view of a second member of the first exemplary embodiment.
Figure 6B:
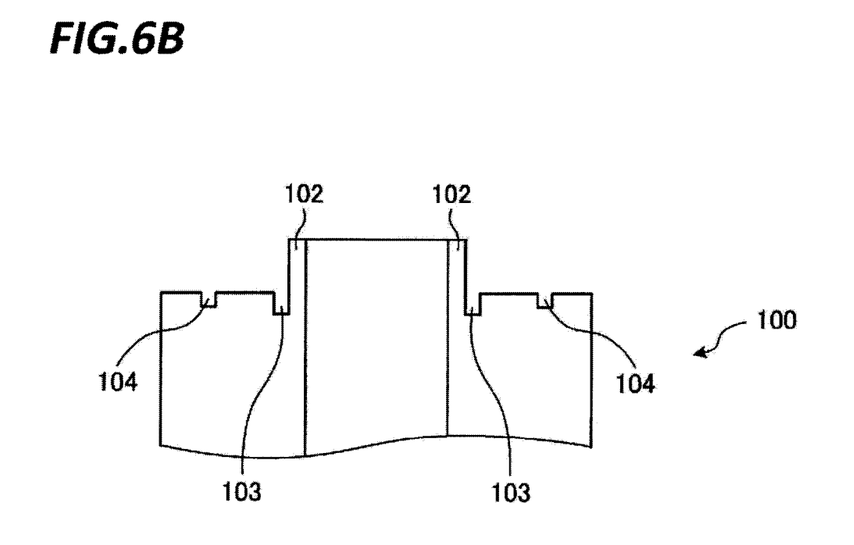
FIG. 6B is an example of a cross-sectional view of a second member of the first exemplary embodiment.

FIG. 6A is an example of a perspective view of the second member of the first exemplary embodiment. FIG. 6B is an example of a cross-sectional view of the second member of the first exemplary embodiment.

As illustrated in FIGS. 6A and 6B, the second member 100 includes a convex portion 102 which encloses the opening into which the connecting shaft 55c is inserted and a groove 103 which is provided around the convex portion 102, and a groove 104 having a larger diameter than that of the groove 103, on the second surface 81. Grease to be described below is provided in the groove 103. In the example illustrated in FIGS. 6A and 6B, two grooves are provided, but the present invention is not limited thereto and the number of grooves may be one or three or more.

Figure 7A:
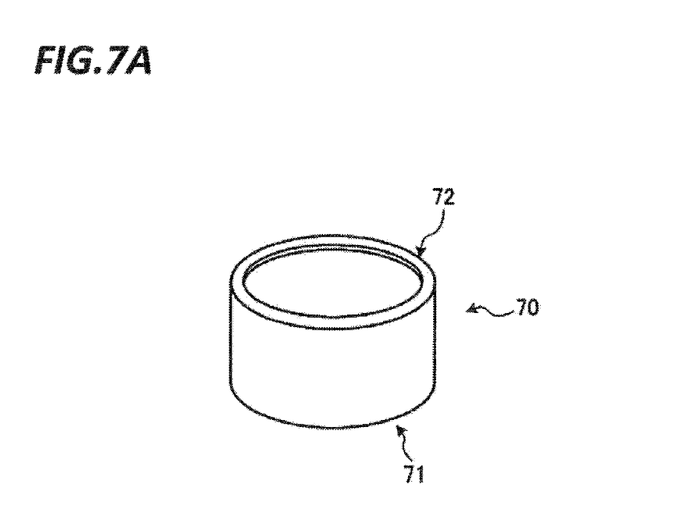
FIG. 7A is an example of a perspective view of a decaying mechanism of the first exemplary embodiment.
Figure 7B:
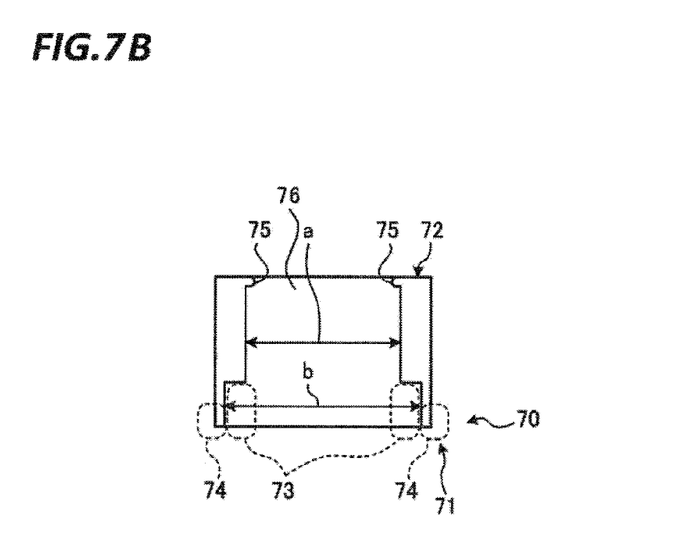
FIG. 7B is an example of a cross-sectional view of a decaying mechanism of the first exemplary embodiment.

FIG. 7A is an example of the decaying mechanism of the first exemplary embodiment. FIG. 7B is an example of a cross-sectional view of the decaying mechanism of the first exemplary embodiment.

As illustrated in FIGS. 7A and 7B, the decaying mechanism 70 has an opening through which the connecting shaft 55c is inserted and provided in the bearing member 55d so as to be enclosed by the first member 80 and the second member 100. Specifically, a first surface 72 of the decaying mechanism 70 is provided so as to be in contact with the first member 80 and a second surface 71 of the decaying mechanism 70 is provided so as to be in contact with the second member 100. Here, as indicated by an arrow a and an arrow b of FIG. 7B, a diameter of the opening in a region represented by a broken line 73 at the second surface 71 of the decaying mechanism 70 is larger than that of other portions and the second surface 71 is engaged with the convex portion 102 of the second member 100 in the region of the broken line 73. Further, the convex portion 74 of the decaying mechanism 70 which faces the second surface 71 is fitted into the groove 103 of the second member 100. That is, the decaying mechanism 70 includes convex portions 74 which are provided between an inner wall of the second member 100 which faces the connecting shaft 55c and the connecting shaft 55c and between an inner wall of the first member 80 which faces the connecting shaft 55c and the connecting shaft 55c and extends in an extension direction of the connecting shaft 55c to be fitted into the groove 103 of the second member 100. Further, as illustrated in FIG. 7B, in the decaying mechanism 70, a convex portion 75 is formed at an inner side which is in contact with the connecting shaft 55c and a tip end of the convex portion 75 is in contact with the connecting shaft 55c.

Figure 8:
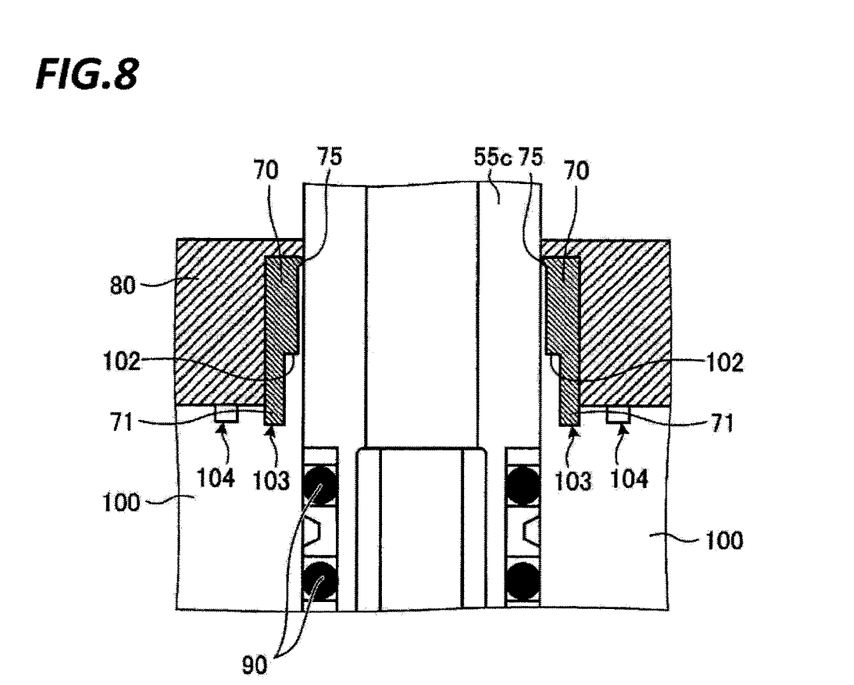
FIG. 8 is a cross-sectional view illustrating a relationship of a decaying mechanism, a sealing machine, a first member, and a second member of the first exemplary embodiment.

Here, a relationship between the decaying mechanism 70 and the sealing member 90 will be described in more detail with reference to FIG. 8. FIG. 8 is a cross-sectional view illustrating a relationship of a decaying mechanism, a sealing machine, a first member, and a second member of the first exemplary embodiment. As illustrated in FIG. 8, the first member 80 is provided in a portion of the second member 100 which faces the shutter 55a. Further, the decaying mechanism 70 is provided in the bearing member 55d so as to be covered by the first member 80 and the second member 100. Specifically, the decaying mechanism 70 is provided in the opening of the first member 80 which is opposite to the shutter 55a and the second member 100 is provided so as to cover a surface of the decaying mechanism 70 and the first member 80 which is opposite to the shutter 55a. Further, as described above, the decaying mechanism 70 is engaged with the convex portion 102 and the groove 103 of the second member 100 to be accommodated therein. In other words, the convex portion 74 of the decaying mechanism 70 is disposed in the groove 103 of the second member 100.

The sealing member 90 will be further described. The sealing member 90 is, for example, an O-ring. Here, the O-ring is desirably made of a material having a tensile strength larger than 12.1 MPa and more desirably, equal to or larger than 15.4 MPa. Further, hardness of the O-ring is desirably larger than 62 ShoreA and more desirably equal to or larger than 70 ShoreA. Further, an elongation (%) of the O-ring is desirably high, for example, desirably higher than 250% and more desirably 300% or higher.

It is desirable that the O-ring is used together with grease. For example, fluorine grease is desirably used as the grease.

Figure 9:
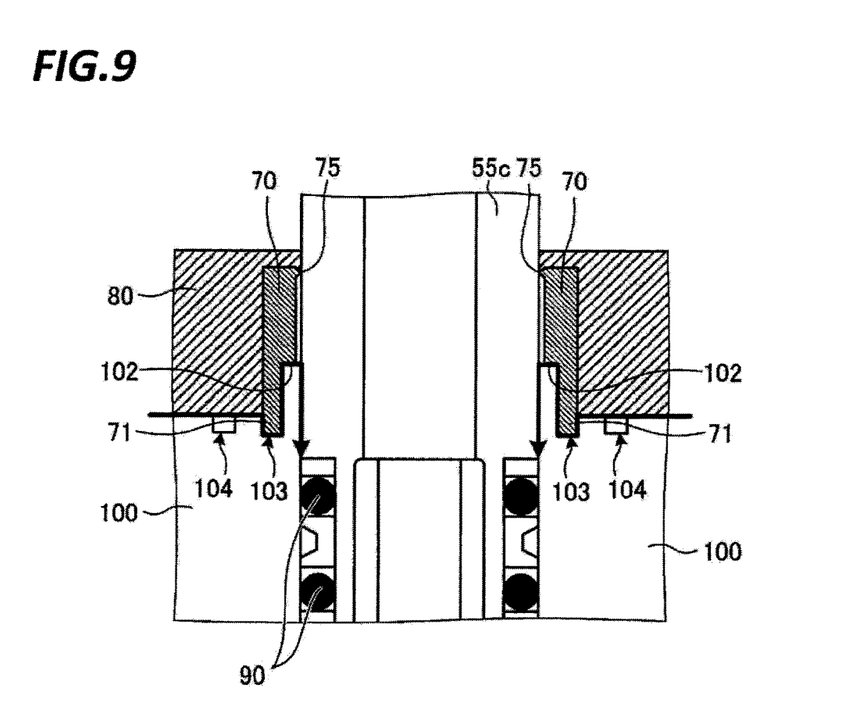
FIG. 9 is a view illustrating a radical invasion path of the first exemplary embodiment.

FIG. 9 is a view illustrating a radical invasion path of the first exemplary embodiment. In the related art, a configuration having a sealing member and a block which covers the sealing member is provided, so that the radical or the ion cannot be trapped. Therefore, the radical or the ion reaches the sealing member through a path of a contacted portion to cause damage, so that the vacuum is leaked. In consideration of the above description, of the first exemplary embodiment, as described above, the connecting shaft 55c is inserted in the bearing member 55d and the bearing member 55d includes a decaying mechanism 70 which decays the radical or the ion, a first block type of a first member 80 which covers the decaying mechanism 70, and a second block type of a second member 100 which is disposed at the connecting shaft 55 and into which the connecting shaft is inserted while being in contact with a sealing member that blocks the atmosphere. An end of the first member 80 and an end of the second member 100 are connected to be engaged with each other, an invasion path through which the radical invades from the connecting unit is formed, and the path is formed to be folded back in the extending direction of the connecting shaft 55c. The sealing member 90 is made of a material having a tensile strength which is larger than 12.1 MPa. As a result, as represented by the arrow in FIG. 9, even though the radical which is generated in the chamber 10 invades between the first member 80 and the second member 100 through the invasion path, the radical passes through a radical trap which is folded back in the extension direction of the connecting shaft 55c which is formed by greases provided in the groove 103 or 104 of the second member 100, the groove 103 of the second member 100, the convex portion 102, and the convex portion 74 of the decaying mechanism 70 and then reaches the sealing member 90.

As described above, the substrate processing apparatus according to the first exemplary embodiment includes a chamber 10, a shutter 55a which opens or closes the opening of the chamber 10 from the inside of the chamber 10, a driving unit 55b which opens or closes the shutter 55a, a connecting shaft 55c which is a shaft connecting the shutter 55a and the driving unit 55b, and a bearing member 55d which has a decaying mechanism which decays the radical and a sealing member which is formed by a material whose tensile strength is larger than 12.1 MPa, in this order, as a bearing supporting the connecting shaft 55c. As a result, air-tightness of the chamber 10 may be maintained. Specifically, the shutter 55a is opened and closed, so that the radical or the ion which invades the shutter member 55 is inactivated by the decaying mechanism so as not to reach the sealing member, so that damage to the sealing member is prevented. As a result, the vacuum is maintained to prevent a leak rate of the shutter member 55 from being lowered and thus the air-tightness of the chamber 10 may be maintained.

It will be specifically described that the leak rate of the shutter member is lowered due to the radical that invades the shutter member when the shutter of the plasma processing apparatus is opened and closed. It is understood that when the O-ring of the shutter member is deteriorated due to the radical or the ion of the plasma which is generated in the chamber, if the O-ring is replaced with an O-ring which has a high radical resistance, the leak rate is not sufficiently lowered. Further, when the O-ring is replaced from Viton (D0270) of the related art with DC156 having a better radical resistance than Viton, deterioration of the leak rate is not sufficiently lowered.

Figure 10:
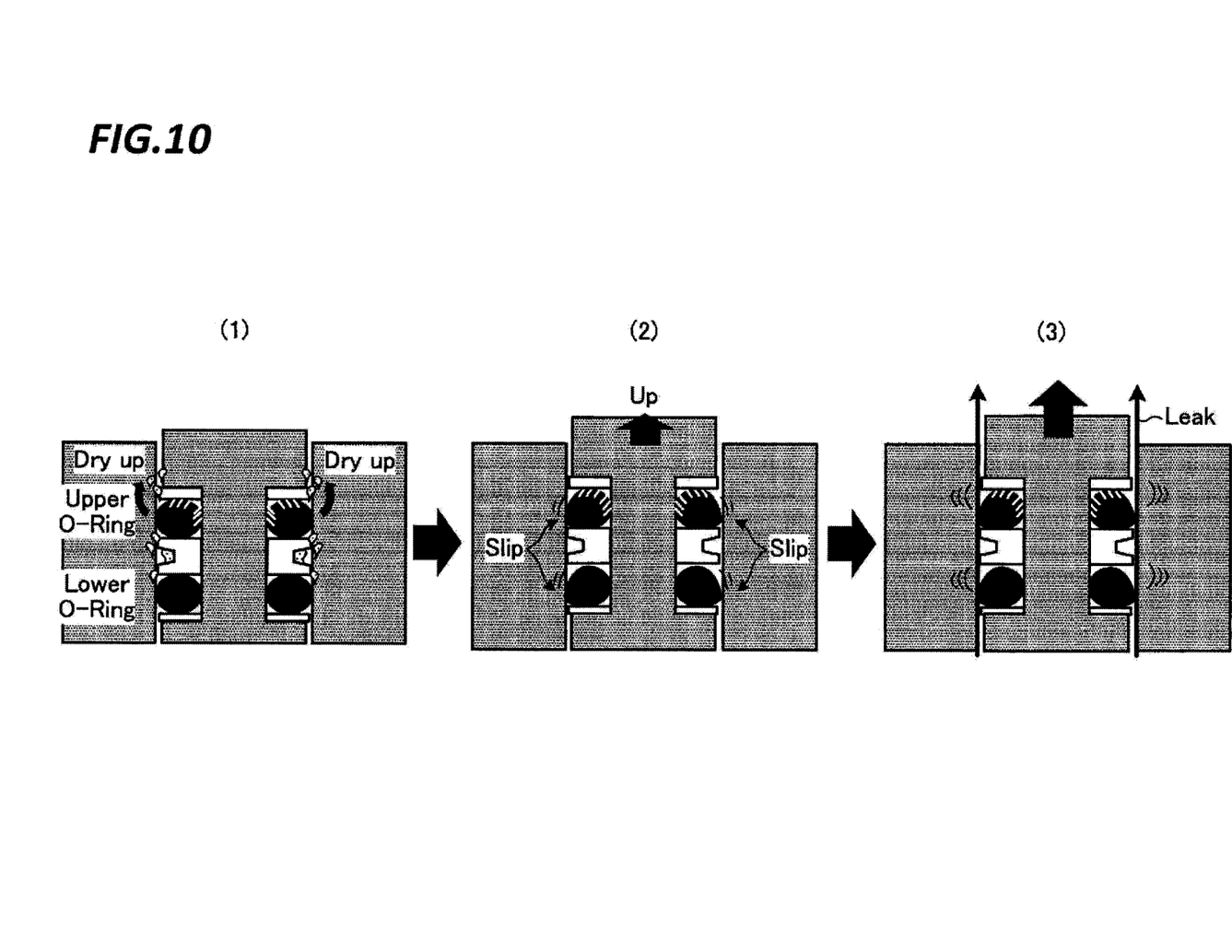
FIG. 10 is a view illustrating an example of a comparative experiment result of deterioration of an O-ring.

FIG. 10 is a view illustrating an example of a comparative experiment result of deterioration of an O-ring. As a comparative example, as an O-ring having a relatively strong radical resistance and a relatively weak mechanical strength, DC156 (hardness is 62 Shore A, tensile strength is 12.1 MPa, an extension rate is 250%, and 100% stress is 1.5 MPa) is used, so that the shutter member which does not configure the decaying mechanism is used. Further, as an exemplary embodiment, together with the above-described decaying mechanism, an experiment is performed with Viton (D270) (hardness is 70 ShoreA, tensile strength is 15.4 MPa, an extension rate is 300%, and 100% stress is 3.6 MPa) having lower radical resistance and higher mechanical strength than those of the DC156. In a specific condition where a processing pressure is 200 mT, RF power is HF=2700 W and LF=1500 W, as a processing gas, C4F8/O2=20/400 sccm and a back pressure (BP: a back pressure when He gas flows between the wafer and the susceptor) is 15/15, and the processing was performed for ten minutes.

Figure 11:
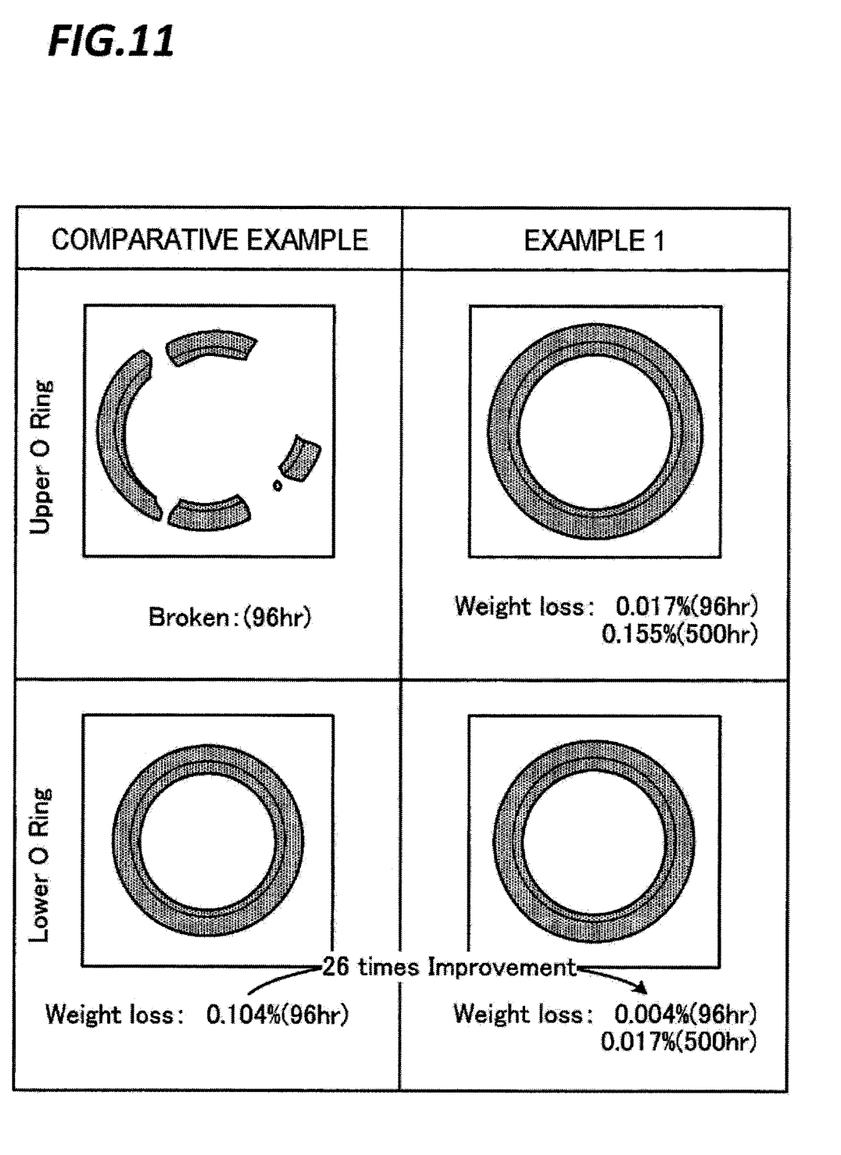
FIG. 11 is a view illustrating an example of an O-ring deteriorating machine.

FIG. 11 is a view illustrating an example of an O-ring deteriorating structure. That is, as illustrated in FIG. 10(1), in the presence of the heat or the radical, the grease which is used together with the O-ring is reduced due to the deterioration as time passes by. Here, it is considered that when as the O-ring, an O-ring having a relatively high radical resistance but a relatively low mechanical strength is used, as illustrated in FIG. 10(2), the O-ring is more fractionized to be slipped by opening and closing the shutter. As a result, as illustrated in FIG. 10(3), it is considered that this is the reason why in spite of using the O-ring having a relatively strong radical resistance, the deteriorating speed of the leak rate is not reduced.

As illustrated in FIG. 11, the 96 hours later O-ring of Comparative Example was deteriorated to be broken, but the 500 hours later O-ring of the example was not deteriorated. More specifically, in Comparative Example, the O-ring is deteriorated and broken after 96 hours. In contrast, in Example 1, reduction of a mass is 0.017% 96 hours later and 0.155% 500 hours later which is merely in an error range.

Figure 12:
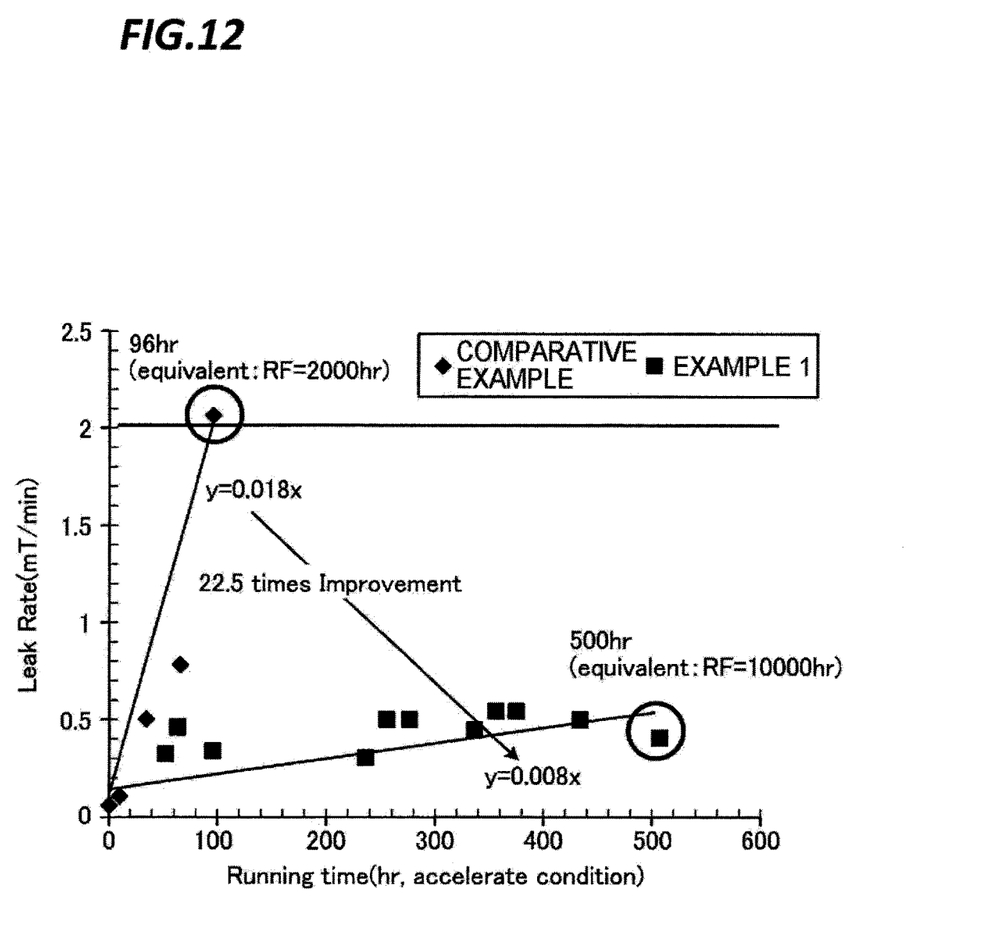
FIG. 12 is a view illustrating a leak rate result.

FIG. 12 illustrates a result of a leak rate. As illustrated in the drawing, when the leak rate is compared with that of Comparative Example, even though the radical resistance of the O-ring of Example 1 is lowered, the leak rate is approximately 22.5 times more improved, which subsequently means that the leakage is very small.

In consideration of these facts, as described above, in the first exemplary embodiment, together with the decaying mechanism, an O-ring having a mechanical strength which is larger than 12.1 MPa with grease is used, so that the deterioration of the O-ring due to the radical which invades the shutter member 55 by opening and closing the shutter 55a is suppressed, thereby preventing the leak rate of the shutter member 55 from being lowered. As a result, the air-tightness of the chamber 10 may be maintained.

According to the substrate processing apparatus of the first exemplary embodiment, the decaying mechanism is a radical trap ring and has, as an invasion path through which the radical invades, a path which is folded back in the extension direction of the connecting shaft. As a result, without increasing the width of the shutter member including the connecting shaft, a compact radical trap structure may be introduced.

The sealing member is an O-ring and the O-ring is used to maintain the air-tightness of the chamber 10. Further, fluorinated grease is used together, so that the leakage is further prevented and the deterioration of the O-ring is prevented.

According to the substrate processing apparatus of the first exemplary embodiment, the bearing member 55d includes the first member 80, the second member 100, and the third member 76. As a result, the radical or the ion which invades the shutter member 55 by opening and closing the shutter 55a is deactivated to suppress the deterioration of the O-ring of the shutter member 55, thereby preventing the leak rate from being lowered. As a result, the air-tightness of the chamber 10 may be maintained for a long time.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus, comprising:
   a chamber provided with an opening and maintained air-tightly by depressurization;
   a gate valve configured to carry the substrate into or out of the chamber, and open or close the opening;
   a shutter configured to open or close the opening from the inside of the chamber;
   a connecting shaft connected to the shutter and configured to move the shutter up or down in accordance with a driving force; and
   a bearing member provided surrounding the connecting shaft and configured to block the chamber from an atmosphere and, at the same time, decay radicals or ions;
   wherein the bearing member includes:
   a ring provided with the connecting shaft inserted therein and configured to decay the radicals or the ions;
   a first block type of a first member configured to cover the ring; and a second block type of a second member disposed at the connecting shaft and provided with the connecting shaft inserted therein while being in contact with at least one O-ring that blocks the atmosphere, an end of the first member and an end of the second member are connected to be engaged with each other, an invasion path is formed to allow the radicals to invade from the connected portion of the end of the first member and the end of the second member, and the invasion path is formed to be folded back in an extending direction of the connecting shaft, and the at least one O-ring is made of a material having a tensile strength larger than 12.1 MPa, and wherein the second member comprises a first convex portion protruding from an upper surface of the second member, the first convex portion has a shape of a cylindrical sleeve extending along a direction of the connecting shaft, an inner surface of the first convex portion is in contact with the connecting shaft, and an outer surface of the first convex portion is in contact with the ring.

2. The substrate processing apparatus of claim 1, wherein the ring is formed with a second convex portion in an inner side which is in contact with the connecting shaft, and a tip end of the second convex portion is in contact with the connecting shaft.

3. The substrate processing apparatus of claim 1, wherein the ring is a radical trap ring.

4. The substrate processing apparatus of claim 1, wherein the at least one O-ring comprises a fluorinated O-ring.

5. An apparatus, comprising:
a shutter configured to open or close an opening of a chamber which is maintained air-tightly by depressurization, from the inside of the chamber;
a connecting shaft connected to the shutter and configured to move the shutter up or down in accordance with a driving force; and
a bearing member provided surrounding the connecting shaft to block the chamber from an atmosphere and decay radicals or ions,
wherein the bearing member includes:
a ring provided with the connecting shaft inserted therein and configured to decay the radicals or the ions;
a first block type of a first member configured to cover the ring; and
a second block type of a second member disposed at the connecting shaft and provided with the connecting shaft inserted therein while being in contact with at least one O-ring that blocks the atmosphere, an end of the first member and an end of the second member are connected to be engaged with each other, an invasion path is formed to allow the radicals to invade from the connected portion of the end of the first member and the end of the second member, and the invasion path is formed to be folded back in an extending direction of the connecting shaft, and the at least one O-ring is made of a material having a tensile strength larger than 12.1 MPa, and wherein the second member comprises a first convex portion protruding from an upper surface of the second member, the first convex portion has a shape of a cylindrical sleeve extending along a direction of the connecting shaft, an inner surface of the first convex portion is in contact with the connecting shaft, and an outer surface of the first convex portion is in contact with the ring.

6. The apparatus of claim 5, wherein the ring is formed with a second convex portion in an inner side which is in contact with the connecting shaft, and a tip end of the second convex portion is in contact with the connecting shaft.

7. The apparatus of claim 5, wherein the ring is a radical trap ring.

8. The apparatus of claim 5, wherein the at least one O-ring comprises a fluorinated O-ring.

9. The substrate processing apparatus of claim 2, wherein the second member comprises a first groove provided on the upper surface adjacent to and concentric with the first convex portion.

10. The substrate processing apparatus of claim 9, wherein the second the ring further includes a third convex portion, and wherein the third convex portion is configured to fit into the first groove of the second member.

11. The substrate processing apparatus of claim 10, wherein the second member further comprises a second groove provided on the upper surface, and the second groove is concentric with the first groove.

12. The apparatus of claim 6, wherein the second member comprises a first groove provided on the upper surface adjacent to and concentric with the first convex portion.

13. The apparatus of claim 12, wherein the ring further includes a third convex portion, and wherein the third convex portion is configured to fit into the first groove of the second member.

14. The apparatus of claim 13, wherein the second member further comprises a second groove provided on the upper surface, and the second groove is concentric with the first groove.

* * * * *